(12) United States Patent
Koch

(10) Patent No.: US 7,768,292 B1
(45) Date of Patent: Aug. 3, 2010

(54) NON-INVASIVE POWER SUPPLY TESTER

(76) Inventor: James Kristian Koch, 1319 Stonebridge Way, Roseville, CA (US) 95661

( * ) Notice: Subject to any disclaimer, the term of this patent is extended or adjusted under 35 U.S.C. 154(b) by 0 days.

(21) Appl. No.: 12/455,733

(22) Filed: Jun. 6, 2009

(51) Int. Cl.
G01R 31/36 (2006.01)
(52) U.S. Cl. ...................................... 324/771
(58) Field of Classification Search .................. None
See application file for complete search history.

(56) References Cited

U.S. PATENT DOCUMENTS

| 4,037,156 | A  | * | 7/1977  | Goujon et al. | ............... 324/771 |
| 7,330,024 | B2 | * | 2/2008  | Hashimoto     | ............... 324/158.1 |
| 7,436,200 | B1 | * | 10/2008 | Jacobsen et al. | ............ 324/771 |
| 2006/0072273 | A1 | * | 4/2006 | Hashimoto | ................. 361/93.1 |

* cited by examiner

Primary Examiner—Jermele M Hollington

(57) ABSTRACT

The output current of a switching regulator in operation on a printed circuit board can be accurately measured without opening the circuit, and without specially dedicated sensing components in the regulator. The inherent series resistance of an inductor or similar resistive component can be used—even though it's resistance and its temperature are unknown. The apparatus is easily extended to make other measurements such as transient response and output impedance. These measurements are generally easier to perform and more convenient than other commonly used methods. Key elements are an injector circuit (312), a voltmeter circuit (310), a control unit with arithmetic capability (316), a user input unit (324) and a user output unit (326).

9 Claims, 14 Drawing Sheets

NON-INVASIVE POWER SUPPLY TESTER

CROSS-REFERENCE TO RELATED APPLICATIONS

Not applicable

FEDERALLY SPONSORED RESEARCH

Not applicable

SEQUENCE LISTING OR PROGRAM

Not applicable

BACKGROUND OF THE INVENTION

1. Field

Figure 1:
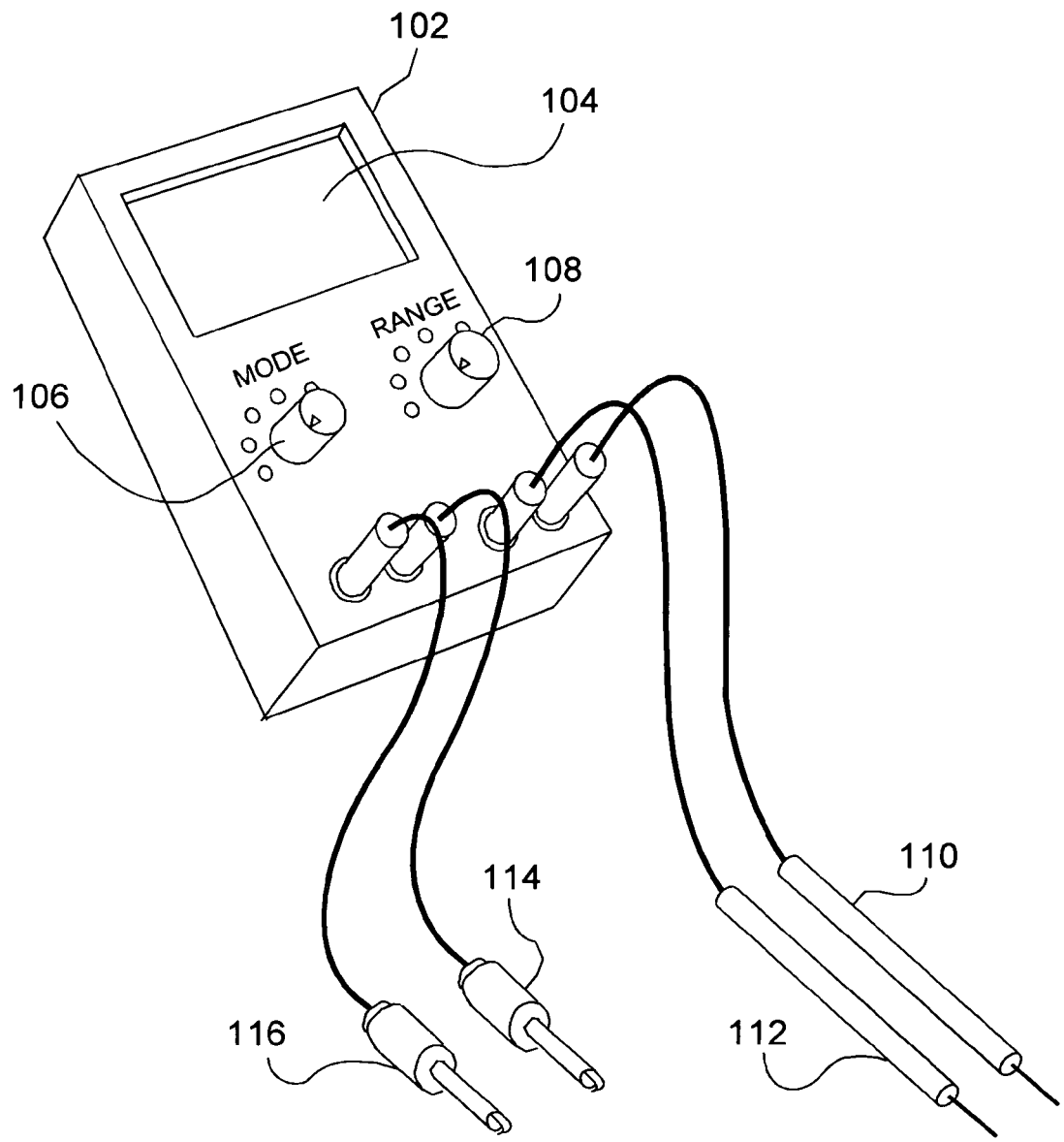

This invention generally relates to the field of electrical measurement, specifically to a method for measuring the output characteristics of an electrical power supply while it is operating in a system. These measurements include those of output current, output voltage, output impedance, and transient response. During the development of electric or electronic equipment it is often necessary to measure these parameters while the power supply it is in actual service, for the purpose of design verification.

2. Prior Art

Characterization of the output of a deployed power source requires knowledge of the electrical current being supplied to the load. Previously, devices which measured electrical current were generally referred to as "ammeters", "current probes", or "embedded current sensors" and there were a number of current sensing methods used.

1. CONVENTIONAL AMMETER—The circuit under test is opened, and the ammeter is connected in across the break so that the current in question is forced to flow through the ammeter. Within the ammeter, there is a transducer that converts the magnitude of the current to some kind of visible user display or recordable data. An example of this prior art is the ubiquitous hand-held digital multimeter (DMM), when set up as an ammeter.

2. MAGNETIC CURRENT PROBE—A structure of high permeability material is positioned around or near to the circuit under test in such a fashion that the magnetic field produced by the circuit under test causes a proportional and detectable signal to appear in the detector circuits, which in turn can be converted to a visible user display or recordable data. An example of this prior art is the Tektronix® A6312 Current Probe.

3. EMBEDDED SENSORS are components permanently designed into the circuit under test which always have the current to be measured flowing through them. These can be used to measure that particular current without having to use an ammeter or current probe. For example, a low value resistor may be built into the circuit such that at any time later, measuring the voltage across this resistor with a conventional voltmeter will give an indication of the current flowing through it by the application of Ohms Law. Another example would be an embedded Hall Effect sensor such as the Allegro® ACS713, used in the same way.

4. VOLTAGE ACROSS EXISTING COMPONENT—In this method, the circuit to be tested must have an existing component that is carrying the current of interest, and that has enough impedance so that it is practical to measure the voltage across it, and calculate the current by the application of Ohms Law. This requires that the impedance of the conductor be known with suitable accuracy. An example of this is measuring the DC voltage across an inductor, and using the series resistance of the inductor to calculate the current.

DISADVANTAGES OF PRIOR ART

1. CONVENTIONAL AMMETER—Use of this device requires that the circuit to be tested be physically broken or disconnected at some point, so that the ammeter can be connected in series with the conductor of interest. This is often impossible or undesirable. One prominent example is the case of a trace on a printed circuit board. To place a conventional ammeter in series with a trace one has to cut the trace, which damages the PC board, or unsolder a component, which risks damage to the board and/or the component, and increases the risk of future failure of the board. Another method is to cut a permanently installed wire, which would then have to be repaired, degrading the reliability of the installation.

2. MAGNETIC CURRENT PROBE—Use of this device requires that the conductor of interest be completely surrounded by free space with volume sufficient to allow clipping the current probe completely around the conductor. This is a disadvantage when the conductor is mounted without the required free space around it, and thus requires physical modification of the circuit, product or installation being tested. This is particularly the case when the power supply under test is entirely embedded on a printed circuit board.

3. EMBEDDED SENSORS—The embedded sensor can be a low value resistor, or a Hall-effect or other magnetic current sensor. In any case, this has the disadvantages of (a) added cost of the sensor to the product, (b) additional space for the sensor needed in the product, (c) additional impedance permanently added to the circuit where it could decrease efficiency, or degrade performance.

4. EXISTING CIRCUIT COMPONENT AS A SENSOR—A common example of this is to use the inherent resistance of an inductor that is in series with the output of a switching regulator. By low-pass filtering the voltage across the inductor, the DC current in the inductor can be more easily measured. The disadvantage of this method in the past has been that the resistance of the existing circuit component (e.g. inductor) is not accurately known, and the error in the current measurement can easily be 30%. This error can be reduced by calibrating the component resistance before the circuit is placed in service, but this requires access to the supply while it is out of service, and takes extra time, and even then, it still is limited by an error due to the change in the component resistance when it's temperature changes due to operating conditions in service. This change in resistance is commonly due to the temperature coefficient of the resistance of copper. To avoid this error would require, in addition to out-of-service calibration of the component resistance, a temperature measurement of the copper conductor while in service at the time of the voltage drop measurement, requiring more time and more equipment.

ADVANTAGES OF THE NON-INVASIVE POWER SUPPLY TESTER

1. Output current of a power supply can be measured without the disadvantages of the prior art. One can quickly, conveniently, accurately, and without physical alteration, measure the output current of a wide variety of power supplies while they are in service, even though no provision for this has been designed into the supply itself.

2. The non-invasive tester can easily be equipped or combined with useful functions beyond that of accurately measuring output current. Examples are measurements of output voltage, current limiting, transient response, and output impedance. Plotting output impedance versus frequency is a very useful characterization of the power supply's ability to handle alternating current variations in output current.

SUMMARY

In accordance with one embodiment of the Non-invasive Power Supply Tester, a small, portable test instrument (FIG. 1) can be connected to a power supply that is operating in a system (FIG. 2), and without any modification to, or previous provision in the circuit, the tester will display an accurate measurement of the output current of the supply. This will result in a reduction in development time, elimination of design errors, and reduced factory cost for a wide variety of products and equipment. Making these measurements more accurate and more convenient will help bring better, more efficient designs to market faster.

DRAWINGS

Figures

| FIG. | CONTENT |
|---|---|
| 1 | Pictorial view of first embodiment |
| 2 | Pictorial view of the first embodiment connected to a power supply under test |
| 3 | block diagram of a first embodiment |
| 4 | detail of the first embodiment |
| 5 | block diagram of first embodiment connected to a unit under test |
| 6 | block diagram of first embodiment connected to a buck regulator |
| 7 | flow chart example for control unit in first embodiment |
| 8 | block diagram of the second embodiment |
| 9 | flow chart example for the control unit in second embodiment |
| 10 | block diagram of third embodiment connected to a unit under test |
| 11 | comparison of injector functions between embodiments |
| 12 | detail of the third embodiment |
| 13 | flow chart example for control unit in third embodiment |
| 14 | example of impedance graph output of third embodiment |

REFERENCE NUMERAL KEY

All reference numerals begin with the figure number that they first appear on. For example item number 509 first appears in FIG. 5, but may appear in other later figures also. Item number 1225 first appears in FIG. 12, but could also appear in FIG. 13, 14, etc.

| REF # | FIG. # (1st appearance) | ITEM IDENTIFIED |
|---|---|---|
| 102 | 1 | Protective enclosure |
| 104 | 1 | Display - specific example of user output unit (326) |
| 106 | 1 | Mode switch |
| 108 | 1 | Range switch |
| 110 | 1 | Voltmeter probe (positive) |
| 112 | 1 | Voltmeter probe (negative) |
| 114 | 1 | Injector probe (positive) |
| 116 | 1 | Injector probe (negative) |
| 202 | 2 | Inductor in power supply under test |
| 204 | 2 | Test point for output voltage of power supply under test |
| 206 | 2 | Test point for ground on power supply under test |
| 208 | 2 | Printed circuit board of power supply under test |
| 210 | 2 | Non-invasive power supply tester |
| 302 | 3 | Positive voltmeter input terminal |
| 304 | 3 | Negative voltmeter input terminal |
| 306 | 3 | Positive injector terminal |
| 308 | 3 | Negative injector terminal |
| 310 | 3 | Voltmeter circuit |
| 312 | 3 | Injector circuit |
| 314 | 3 | Communication link, bi-directional, voltmeter to control unit |
| 316 | 3 | Control unit |
| 318 | 3 | Communication link, control unit to injector |
| 320 | 3 | Communication link, user input to control unit |
| 324 | 3 | User input unit |
| 326 | 3 | User output unit - display(104) is a specific example |
| 402 | 4 | Series resistor |
| 404 | 4 | Shunt capacitor |
| 406 | 4 | Operational amplifier (op amp) |
| 408 | 4 | Mosfet |
| 410 | 4 | Sensing resistor |
| 411 | 4 | Mosfet source |
| 412 | 4 | Digital-to-analog converter (DAC) |
| 414 | 4 | Analog-to-digital converter (ADC) |
| 416 | 4 | Differential amplifier |
| 418 | 4 | Low pass filter |
| 502 | 5 | Power supply under test |
| 504 | 5 | Sensing element |
| 506 | 5 | Load |
| 508 | 5 | Arrow |
| 602 | 6 | Buck regulator circuit |
| 604 | 6 | Inductor |
| 606 | 6 | Load on buck regulator |
| 702 | 7 | Read user input (flow chart block) |
| 704 | 7 | Initialize registers & injector |
| 706 | 7 | Injector off |

-continued

| REF # | FIG. # (1st appearance) | ITEM IDENTIFIED |
|---|---|---|
| 708 | 7 | Wait for T1 |
| 710 | 7 | Read & store V1 |
| 712 | 7 | Injector on |
| 714 | 7 | Wait for T2 |
| 716 | 7 | Read & store V2 |
| 718 | 7 | Calculate & store I |
| 720 | 7 | Branch point N = M? |
| 722 | 7 | Update moving average |
| 724 | 7 | Increment N |
| 726 | 7 | Display moving avg. Iavg |
| 802 | 8 | Digital-to-analog converter (DAC), second embodiment |
| 804 | 8 | Analog output connector |
| 902 | 9 | Scale and send result to output DAC |
| 1002 | 10 | AC injector circuit |
| 1004 | 10 | AC voltmeter circuit |
| 1006 | 10 | Frequency switch |
| 1008 | 10 | Amplitude switch |
| 1010 | 10 | User input unit, third embodiment |
| 1012 | 10 | Mode switch |
| 1102 | 11 | DAC output (injector) |
| 1104 | 11 | DAC output waveform, embodiments 1 & 2 |
| 1106 | 11 | DAC output waveform, embodiment 3 |
| 1204 | 12 | Communication link, control unit to tracking filter |
| 1206 | 12 | Tracking bandpass filter |
| 1208 | 12 | rectifier |
| 1302 | 13 | Initialize registers and injector |
| 1304 | 13 | Read user input |
| 1306 | 13 | Branch point (input changed ?) |
| 1308 | 13 | Set frequency and amplitude of injector |
| 1310 | 13 | Set voltmeter to same frequency, set N = 1 |
| 1312 | 13 | Read and store AC voltmeter |
| 1314 | 13 | Branch point (N = M ?) |
| 1316 | 13 | Increment N |
| 1318 | 13 | Calculate moving average impedance |
| 1320 | 13 | Display frequency and impedance |
| 1402 | 14 | Example impedance graph of one regulator |
| 1404 | 14 | Example impedance graph of another regulator |

DETAILED DESCRIPTION

First Embodiment—FIGS. 1, 2, 3, 4

FIG. 1 is a pictorial drawing of one approach to packaging the first embodiment of the non-invasive power supply tester, intended as a portable test instrument. The protective enclosure (102), is of a size that could be carried in one hand. It is equipped with a display (104), a range switch (108), a mode switch (106), two voltmeter probes (110, 112), and two current injector probes (114, 116). The current injector probes are shown as clips that can be clipped on to test points, wires, or component leads during a test. The voltmeter probes (110, 112) are shown as hand-held probes that the user would hold in position during the test.

Figure 2:
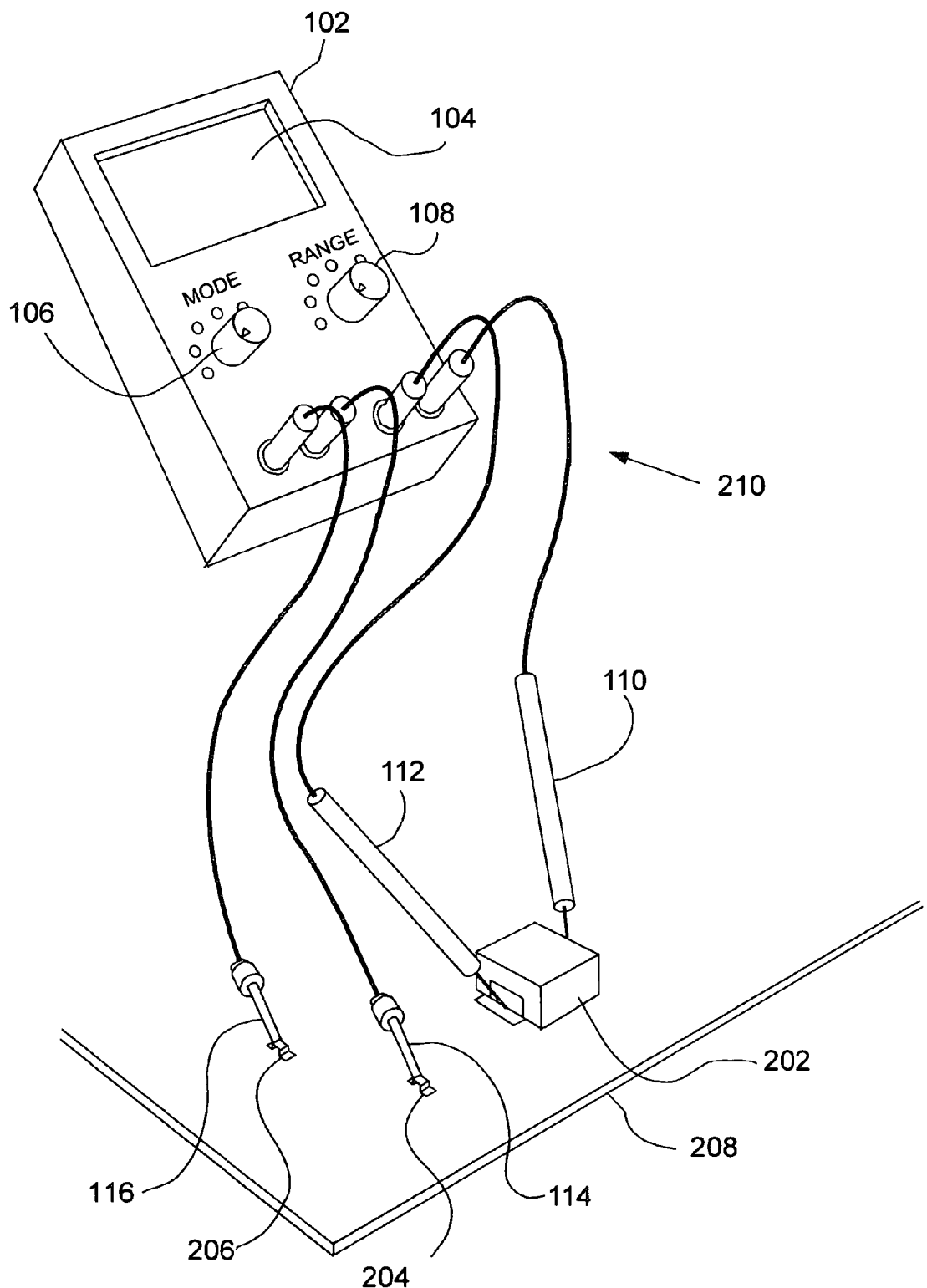

FIG. 2 shows the power supply tester (210) with its probes (110, 112, 114, 116) connected to a printed circuit board (208) being tested. The voltmeter probes (110, 112) are connected directly across an inductor (202) that carries the output current of a switching regulator circuit that is embedded on the printed circuit board (208). The positive current injector probe (114) is clipped to an output voltage test point (204) of the power supply under test. The negative current injector probe (116) is clipped to a ground test point (206).

Figure 3:
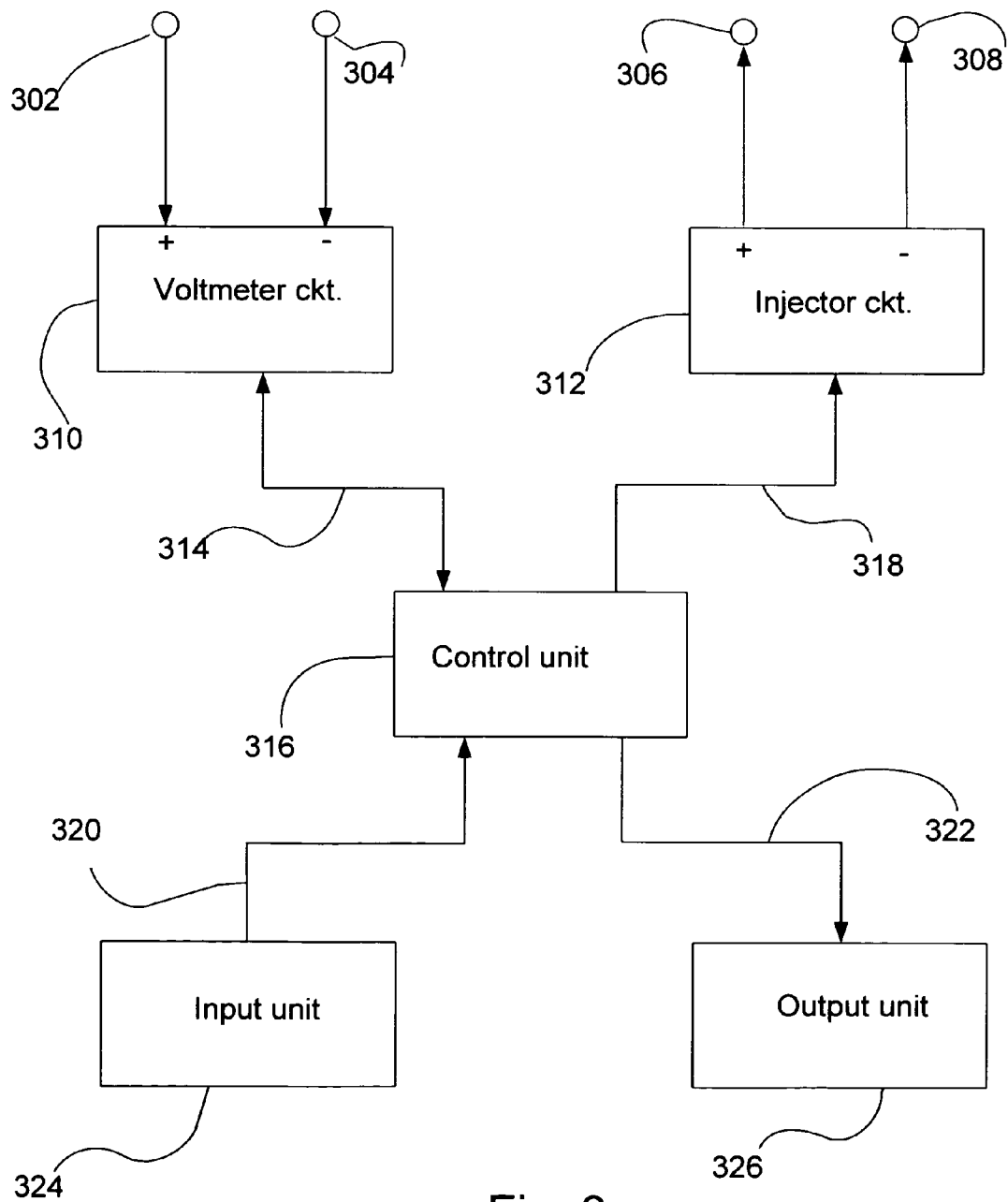

FIG. 3 shows an electrical block diagram of one embodiment of the non-invasive power supply tester. A voltmeter circuit (310) has two input terminals (302, 304) that connect across a sensing resistance in the unit under test (not shown). The voltmeter also has a communication link (314) to a control unit (316). An injector circuit (312) has two output terminals (306, 308) that connect across the load resistance in the unit under test (not shown). The injector circuit (312) also has a communication link (318) to control unit (316). A user input device (324) has a communication link (320) to the control unit, and control unit (316) has a link (322) to a user output unit (326).

Figure 4:
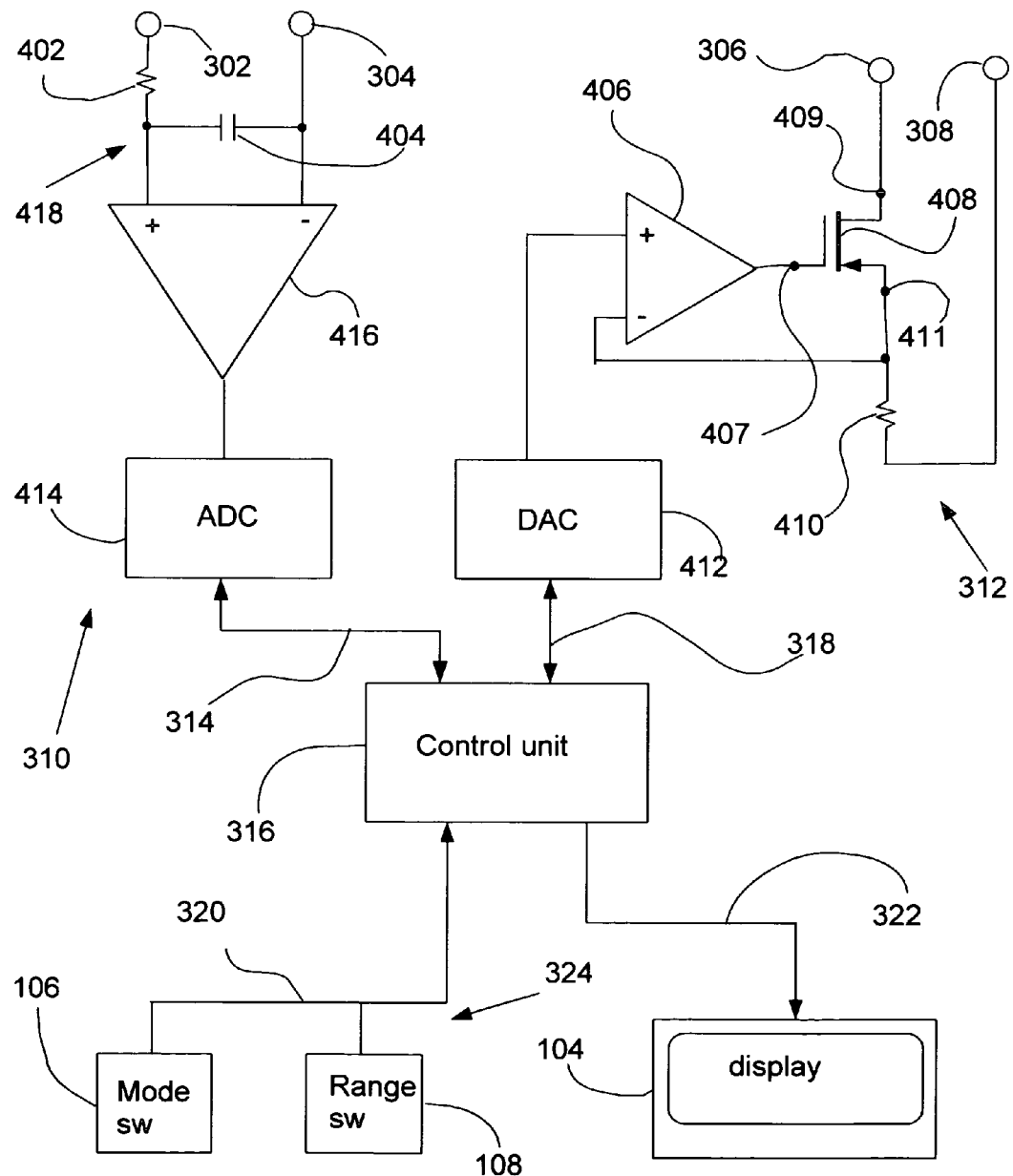

FIG. 4 shows additional detail for the embodiment shown in FIG. 3. It can be seen in FIG. 4 that voltmeter circuit (310) consists of a low-pass filter (418), a differential amplifier (416), and an analog-to-digital converter (ADC) (414). The output of the voltmeter is specifically the output of the ADC, and has a link (314) to control unit (316). Low-pass filter (418) consists of a series resistor (402) and a shunt capacitor (404).

Injector circuit (312) consists of an injector DAC (412) (digital-to-analog converter) that has input link (318) to control unit (316). The output of the injector DAC is connected to the positive input of an operational amplifier (op-amp) (406) driving the gate of an n-channel mosfet (408). The drain of the mosfet (408) is connected to the positive injector terminal (306). The source of the mosfet (408) is connected to a current sense resistor (410), and to the negative input of the op amp (406). The other end of the current sense resistor (410) is connected to the injector circuit negative terminal (308).

Again in FIG. 4, user input unit (324) consists of two multi-position switches (106, 108) that are available to the user, and which have digital outputs to indicate their position. These digital outputs share link (320) to control unit (316).

user output unit (326) in FIG. 4 is a digital display (104), with link (322) to control unit (316).

Operation

First Embodiment—FIGS. 1, 2, 3, 4, 5, 6, 7

Fundamental Process

The first two embodiments of the non-invasive power supply tester utilize the following basic process to measure the output current of a power supply.

1. Identify a two-terminal element that is already in the power supply under test, and that meets the following criteria:
    (a) It is carrying the current that is to be measured
    (b) It has an impedance that generates a voltage that is large enough to be effectively measured by voltmeter circuit (310) when the current to be measured is flowing through it.
    (c) The voltages at either end of this element are within the input common mode range of differential amplifier (416).
    (d) Both ends of this element are accessible for connection to the voltmeter inputs.
    (e) Connection of voltmeter circuit (310) across this element will not interfere with the operation of the power supply under test.
2. Measure and record the voltage across this element while the supply is in the operating state of interest.
3. Using injector circuit (312) force an accurately known change in the output current of the power supply under test. This can be done at any point in the distribution system AFTER the current sensing element chosen. The change in current can be positive or negative or both.
4. Measure and record the CHANGE in voltage caused by the injected change in current.
5. Calculate the original current magnitude (before injection) by the following formula:

$$Iload = \frac{Iinj * V1}{V2 - V1}$$

Where:
Iload is the output current being measured
Iinj is the magnitude of current change injected into the output
V1 is the voltage reading taken before injection
V2 is the voltage reading during injection The equation above is actually the solution to a set of two linear equations with two unknowns. The unknowns are the output current and the operational resistance of the sensing element. The operational resistance is effectively being measured by the injection of a known current.

FIG. 2 shows the first embodiment measuring the output current of a buck regulator on a printed circuit board. The sense element is the main filter inductor (202), common to all buck regulator circuits, and the voltmeter probes (110, 112) are connected directly to the two terminals of the inductor (202). The positive voltmeter probe (110) is connected to the terminal of the inductor where DC current enters, and the negative voltmeter probe (112) where the DC current exits. For a positive buck regulator, DC current exits the inductor terminal that is connected to the output voltage. If the voltmeter (310) is designed to handle input voltages of either polarity, then the voltmeter probe polarity can be ignored. The positive current injector probe (114) is clipped to the output voltage test point, and the negative current injector circuit probe (116) is clipped to a ground test point. The user then sets the mode switch (106) and the range switch (more on this later) and then within a few seconds, the display (104) presents the output current of the buck regulator.

FIG. 3 is a general block diagram of the power supply tester that applies to all embodiments. In this diagram the voltmeter terminals (302, 304) are where the voltmeter probes (110, 112) of the first embodiment (FIG. 1) connect. The injector circuit terminals (306, 308) are where the injector circuit probes (114, 116) of the first embodiment (FIG. 1) connect.

Figure 5:
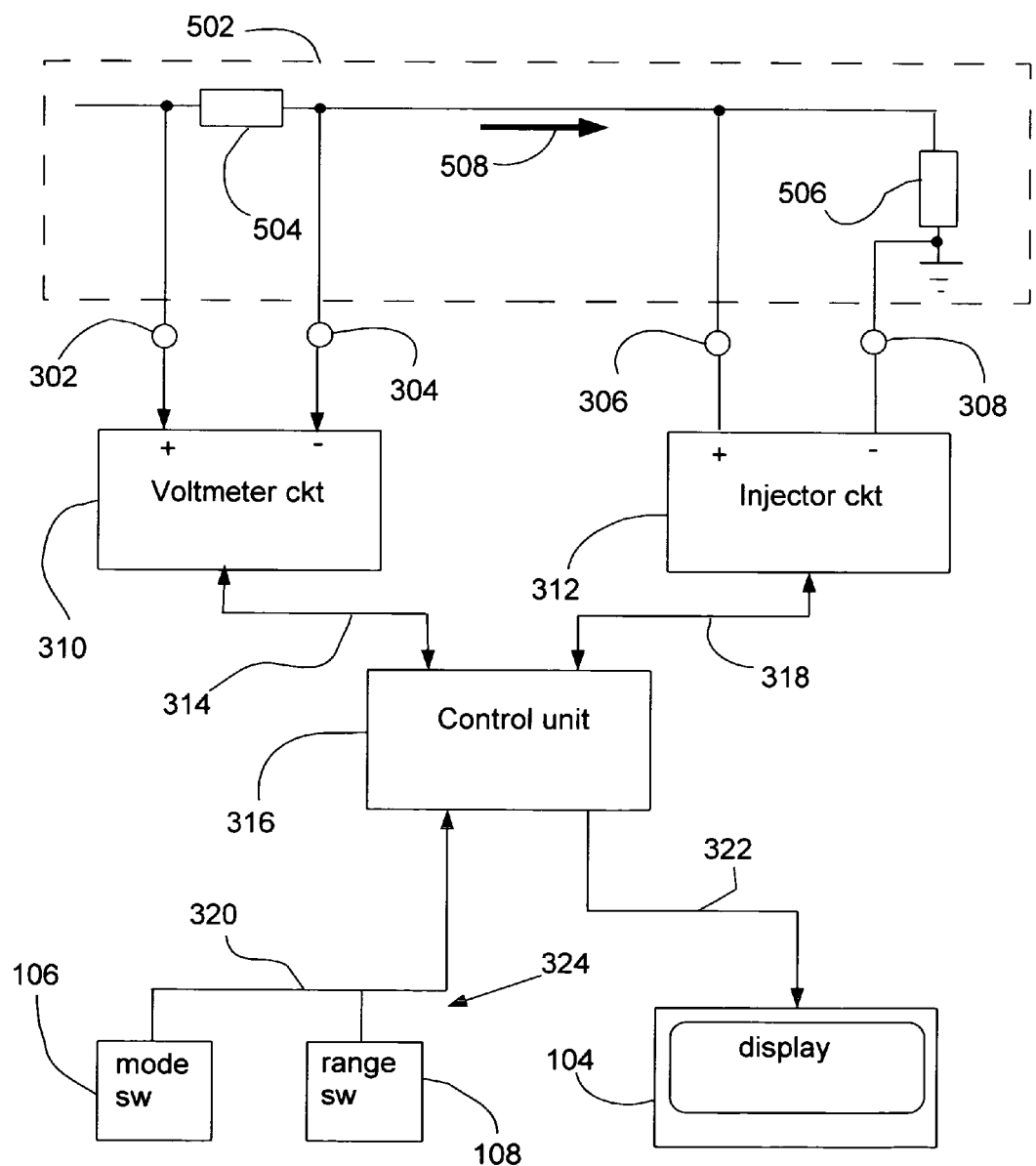

FIG. 5 presents a block diagram of the first embodiment connected to a power supply under test (502). The relevant parts of the power supply that are shown are a sensing element (504) and a load (506). The current to be measured is indicated by an arrow (508). It can be seen that voltmeter input terminals (302, 304) are connected across current sensing element (504), while injector circuit terminals (306, 308) are connected across load (506). The design of the injector circuit must approximate a pure current source at it's output, so that the magnitude of the injected current is not affected by the impedance of the load, or the voltage across the load.

Figure 6:
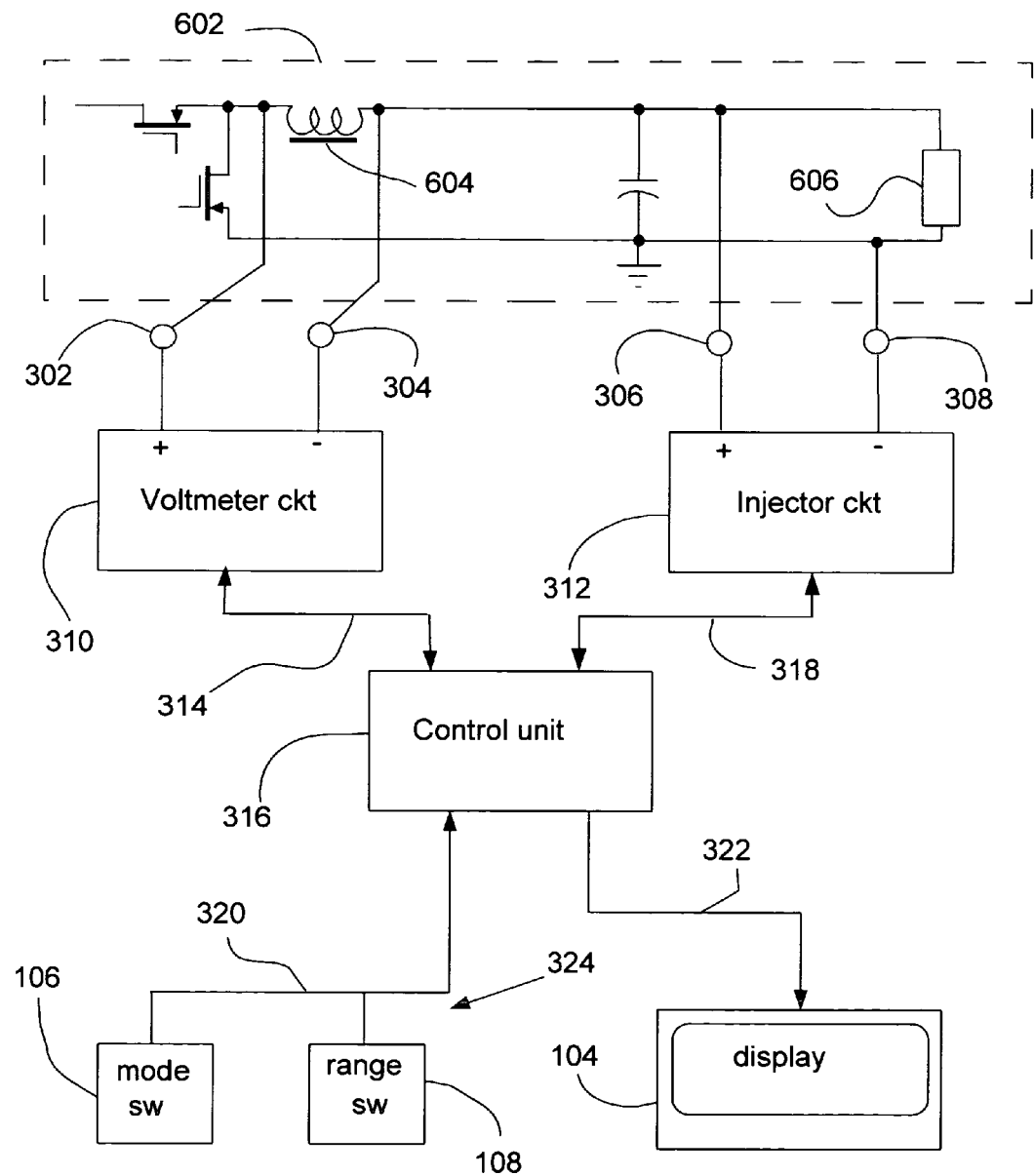

FIG. 6 is a modification to FIG. 5 showing one common example of a power supply circuit, to facilitate explanation of the functions of the various parts of the non-invasive power supply tester. This power supply circuit is commonly called a "buck regulator" (602) and has extremely wide usage in electronic products. In the buck regulator (602) the component chosen as the current sense element is an inductor (604). The inductor meets all of the criteria for a sense element enumerated earlier. Inductor (604) can be effectively modeled as an inductance in series with an equivalent series resistance (ESR) and it is this ESR that will be used to sense the DC current flowing to load (606). Note that the value of the ESR is only approximately known, because it is not a tightly controlled parameter, and because the ESR has a significant temperature coefficient. However, this does not degrade the accuracy of the non-invasive power supply tester because it inherently measures the ESR. The following paragraphs explain the operation of each block in the block diagram of FIG. 5.

Voltmeter (310)

In the buck regulator of FIG. 6, as in any buck regulator, the inductor carries both a direct current and an alternating current. Associated with the AC current, there is a relatively large AC voltage across the inductor. In comparison, the DC voltage is likely to be about 1000 times smaller than the peak-to-peak AC voltage. Therefore a practical design and application of voltmeter (310) requires low-pass filter (418) at the voltmeter input to remove most of the AC voltage. In this particular embodiment series resistor (402) and shunt capacitor (404) comprise the filter, and must be chosen so that the cut-off frequency of filter (418) is lower than the switching frequency of the buck regulator by a factor of at least 1000, so that differential amplifier (416) and ADC (414) will not have to cope with a widely-varying input voltage. It is desirable that differential amplifier (416) "see" only the DC voltage across inductor (604).

Differential Amplifier (416)

The function of differential amplifier (416) is to convert the differentially measured DC voltage across inductor (604) to a ground-referenced, linearly proportional, and suitably scaled voltage to the input of ADC (414). The differential amplifier must have a common mode input range that includes the common mode voltage on inductor (604), which is equal to the DC output voltage of the power supply under test.

ADC (414) (Analog to Digital Converter)

The function of ADC (414) is to convert the analog voltage appearing at its input to a digital representation compatible with control unit (316) and link (314) over which it will be transmitted. ADC (416) must provide range and resolution to meet requirements of the voltage measurements and the accuracy of the calculation of the desired current. There must be enough binary bits in the output so that the subtraction of V1 from V2 as described above, will still have enough significant bits to give adequate resolution in the overall measurement of the desired current. For example, for a typical buck regulator circuit, at least 12 bits of ADC resolution are suggested. The number of required bits for the ADC goes up as the ESR of inductor (604) goes down, and as the magnitude of the current from injector (312) goes down.

Voltmeter (418) is equipped with two probes for connection to power supply under test (602). Negative voltmeter probe (112) connects to negative voltmeter terminal (304). Positive voltmeter probe (110) connects to positive voltmeter terminal (302). It is important that these probes be in continuous good contact with current sense element (504) in power supply under test (502) during the measurement. Although negative voltmeter probe (112) connects to the same power supply node as positive injector probe (114), two probes are recommended because injector probes (114, 116) will carry high current, so if negative voltmeter probe (112) and positive injector probe (114) were combined into one, there could be a voltage measurement error due to the voltage drop across the probe wire.

User Input Device (324)

In this particular embodiment user input device (324) consists of two binary coded switches (106, 108). A binary coded switch is a multi-position mechanical switch operable by the user of the non-invasive power supply tester, and whose outputs comprise a number of contacts which are either open or closed, and they are electrically biased and connected in such a way that control unit (316) is able to read the position of both switches at any time.

Mode Switch

As an example, MODE switch (106) might have the following positions.

Ammeter Normal—In this mode the non-invasive power supply tester will continuously make measurements as rapidly as possible and send each one to display (104).

Ammeter 1 sec Avg—this mode the non-invasive power supply tester will accumulate measurements for 1 second, and then compute the average of all the readings; the display will only show the average readings. This mode would be useful when the output current being measured is rapidly changing.

Ammeter 10 sec Avg—Same as 1 sec Avg mode, but averages are calculated every 10 seconds for additional smoothing of the current reading.

Transient 10%—In this mode voltmeter (310) output is ignored and injector (312) acts as a step-load generator, that is it continuously steps the injected current between zero and a value set by the range switch. The step (increase) in current would only be turned on for 10% of the time. Then if the user connects an oscilloscope to the regulator output, the response to the load steps can be observed. This is a commonly used way to gauge the regulator's control loop stability, speed of response, and ability to hold it's output voltage constant when there are rapid changes in the output current. 10% duty cycle minimizes the increase in average output current.

Transient 50%—same as Transient 10% but with a 50% duty cycle, which can provide a more balanced view of the positive and negative steps.

Off—no measurements are made, and there is no injection current. This allows one to leave the tester connected but allow the power supply to operate without any injected current. This could be used to verify that the tester is not causing an problems when it is making measurements. Or to make other measurements.

Since in this example there are six positions, the switch needs to have at least 3 bits, and up to 8 unique positions would be possible with a 3-bit binary output.

Range Switch (108)

The function of range switch (108) is to set the amplitude of the injected current. The function of range switch (108) is independent of the setting of mode switch (106) except Off, in which case the injection amplitude would be zero. In the example case where range switch (108) is a 3-bit binary switch, there could be eight positions, for example, 0.5A, 1A, 2A, 5A, 10A, 20A, and 50A. These range labels refer to the maximum current reading on that range. The amplitude of the injection current for each range would be perhaps 25% of the range number. For example, on the 20A range, an appropriate injection current would be about 5A.

Instructions for the user would include guidelines for setting range switch (108); the goal is to set it high enough to get a good stable current reading, but not so high as to cause power supply (502) to go into current limiting due to the injected current. Normally, the 5A range will be appropriate for a regulator rated at a maximum of near 5A.

It would also be possible to make the ranging automatic, having control unit (316) start at the low end and keep increasing it until a stable current reading is achieved.

User Output Unit (326)

In this embodiment user output unit (326) consists of a digital display (104) that is driven directly by control unit (316) through link (322). Many other forms of output could be substituted or added, such a DAC driving an analog meter and/or analog voltage output for an external voltmeter or recorder, or a digital output conforming to an established protocol.

Injector Circuit (312)

The function of injector circuit (312) is to cause a change in the output current of the supply under test—a change of precisely known magnitude. This known change is important because it makes it possible to quantify the operating resistance of current sensing element (604) in supply under test (602). The general nature of this circuit must approximate that of an ideal current source (or sink). In this embodiment injector (312) is a calibrated current sink, with a power mosfet (408) for the output driver. In FIG. 4 it can be seen that whatever current flows in mosfet (408) will also flow in current-sense resistor (410) since the (−)input current of the op-amp (406) is insignificant. If the current sense resistor's resistance is accurately known, then the voltage at the source (411) of mosfet (408) will accurately determine the amount of current being pulled from supply under test (502). This voltage is fed back to the negative input of op-amp (406). At the positive input of op-amp (406) is a voltage that comes from the output of injector DAC (412). This voltage may be thought of as a "command voltage" to the injector. Op-amp (406) will apply to gate (407) of mosfet (408), whatever voltage is necessary to cause the feedback voltage to equal the command voltage. Therefore, both the voltage across, and resistance of, the current sense resistor (410) are known so by Ohm's Law the injection current is controlled to be $$Iinj = \frac{Vcom}{Rsen}$$

where
Iinj is the injection current,
Vcom is the command voltage from injector DAC (412), and
Rsen is the value of current sense resistor (410).

It can be seen that whenever the command voltage is greater than zero, the load on the power supply under test will be increased by Iinj, a precisely known amount. Note that this is only one example of an injector circuit, and others are possible, including ones that could both increase and decrease the output current, and ones that could inject AC currents into the power supply under test.

In the design of this circuit it is important that mosfet (408) be chosen carefully to withstand the worst case voltage, current, and power dissipation that will be encountered in the application of the non-invasive power supply tester. The mosfet drain-to-source voltage will be equal to the output voltage of the power supply under test. The current will be equal to the sink current value decided upon for each range, or about 25% of the maximum range value provided. Mosfet (408) may require heat sinking.

For transient testing, it is desirable to have mosfet (408) switch on and off as quickly as possible. This may require some consideration to the design of the injector probes (114, 116) that connect injector (312) to the power supply under test. For fastest switching, the wires of injector probes (114, 116) should be kept as short as possible. It is also necessary to use probe wire of sufficient gauge so that the voltage drop across the wires of injector probes (114, 116) is much smaller than the output voltage of the power supply under test. For higher injection currents it may be necessary to use multiple mosfets in parallel.

To minimize the power dissipation in current sense resistor (410), it may be necessary to provide more than one resistor value, and switch them in and out depending on what range is selected. This can be done by using multiple mosfets where their drain (409) terminals are common, but sources (411) each go to a different current sense resistor. Gate (407) terminals can be selectively connected to the op-amp (406) output depending on the range setting.

Control Unit

In this embodiment control unit (316) is comprised of a microcontroller, and the electrical schematic details of this block are unimportant to the description and understanding of the non-invasive power supply tester.

Figure 7:
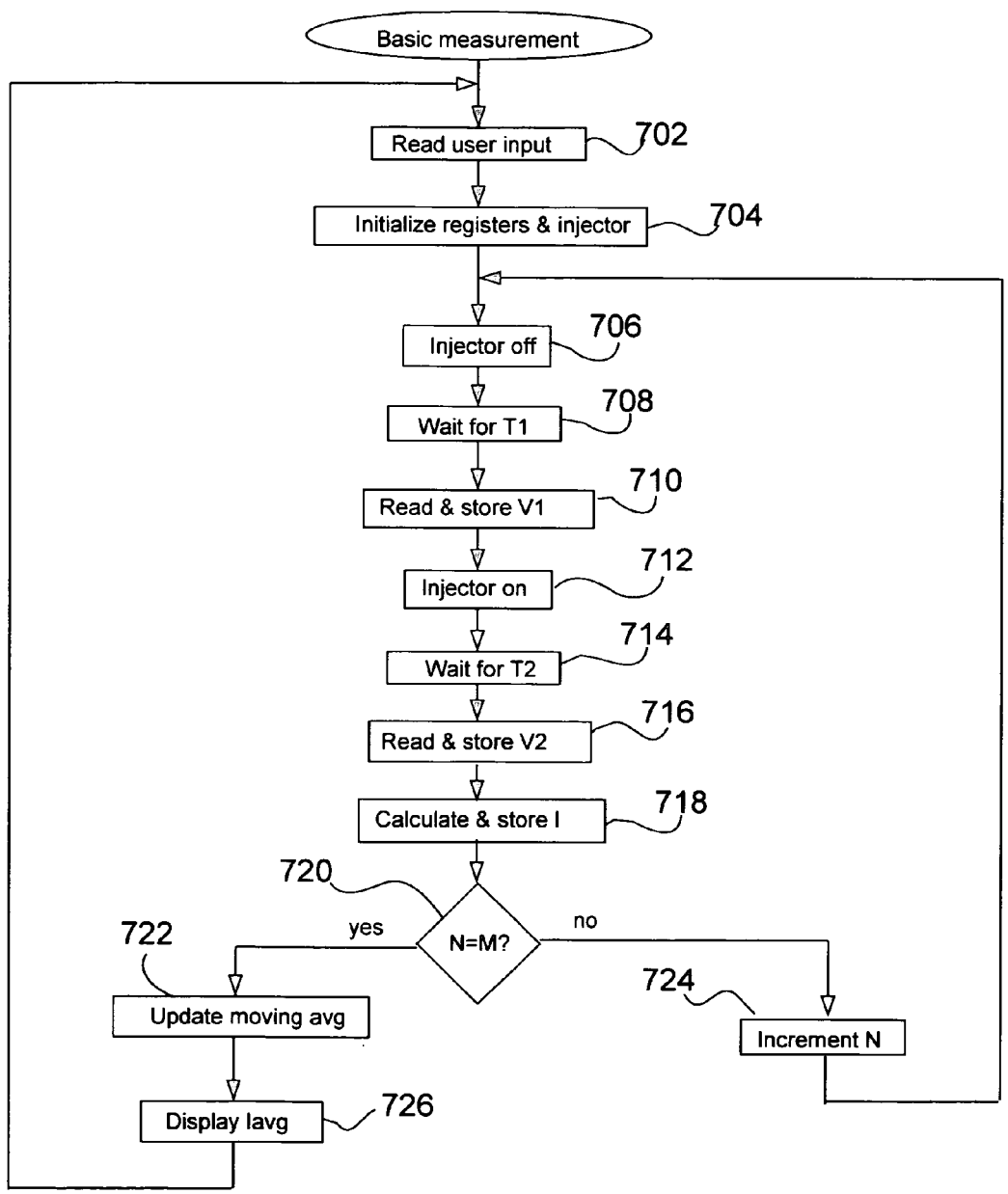

FIG. 7 shows the basic flow chart of the current measurement process for the first embodiment. This flow chart does not show all of the things that the microcontroller must do, but focuses on the basic process of measuring and displaying the output current. It can handle the display of single readings, or the moving average of N readings.

Flow Chart for Basic Measurement (FIG. 7)

The Flow Chart in FIG. 7 outlines the process of basic current measurement with the first embodiment. It does not cover other possible functions of control unit (316) such as transient response or output impedance.

The first step (702) is to read the settings of the user input switches (106, 108); this consists of a mode setting and a range setting. For example the user might have selected "normal" mode, and the "10 Amp" range. This information is loaded into storage registers in the next step (704). If the user has selected NORMAL mode the variable M, representing the number of readings to be averaged, is set to 1. If the user has selected an averaging mode, M is set to a number appropriate to the averaging time. A value for the injection current (Iinj) is stored, appropriate to the range setting. The variable N is set to 1. There may be other initialization requirements, depending on the details of the hardware design. Then (706) current injector (312) is turned OFF so that unit under test (502) is operating at it's normal output current. Then (708) a timer is initialized to a value named T1, from permanent memory. T1 is at least as long as the time required for any transients caused by injector turn off (706) to have passed through low pass filter (418) so that they are not having any effect on the current reading. A value of 5 ms for T1 would be reasonable for most switching regulators. When the timer has timed out (710) a request is sent to voltmeter (310) for a measurement of the DC voltage drop across sense element (504) in the unit under test. When voltmeter ADC (414) signals that it has completed the measurement, that value is stored in memory where we will call it V1. Now (712) signals are sent to injector (312) and it turns on so as to increase the output current of the unit under test by an amount corresponding to the range value stored in (704). Then (714) a value named T2 is loaded into a timer to initiate a wait time so that any transients induced by the injector's turn-on will have time to pass through low pass filter (418) and die out. Again, 5 ms would be reasonable. When the timer times out (716) the DC voltage drop across sense element (504) is read again by voltmeter (310), and the value transferred from ADC (414) to control unit (316) is stored in a register that we call V2.

Now (718) the calculation of the desired current is done, using three values that are stored in memory—the injection current (Iinj), which was stored (704) based on user setting of range switch (108), the first voltage reading V1, and the second voltage reading V2, and using the equation given on page 11. This value is then stored.

At this point (720) there is a branch depending on the value of N. If N is not 1 then we are still in the process of collecting M measurements for an average, so (724) we increment M and go back to take another measurement (706) On the other hand (720), if N=M then (722) we can proceed to calculate the average of the last M measurements and (726) send the result to display (104).

It should be clear that the flow chart in FIG. 7 is just an illustrative example, and it could have any number of variations depending on the particular hardware used and the preferences of the programmer.

Packaging

This embodiment of the non-invasive power supply tester could easily be packaged as a hand held battery-powered portable test instrument. As such it would be very useful in the development and troubleshooting of any kind of electronic circuits where switching power supplies such as the buck regulator are used.

Comments

With this embodiment it can be seen that by connecting four probes from the tester to a buck regulator operating on a printed circuit board, one can obtain an accurate reading of the output current on the regulator. This is done without unsoldering anything on the board, and it does not require the regulator to be equipped with any components that would not otherwise be necessary. The existing alternatives have definite disadvantages in material cost, engineering cost, and project schedule.

This embodiment is not limited to measurements on buck regulators—it can be used on any power circuit where there is an inductor or other suitable low-resistance element in series with the output current. For example, a forward converter also has an inductor in series with each output. The current sensing element could also be a fuse, or a ferrite noise filter, or perhaps even a wire or printed trace. The requirement on the resistance of the current sensing element is just that it's resistance must be high enough so that the injector current multiplied by this resistance can be measured by the voltmeter with the same resolution desired in the current measurement.

Description

Figure 8:
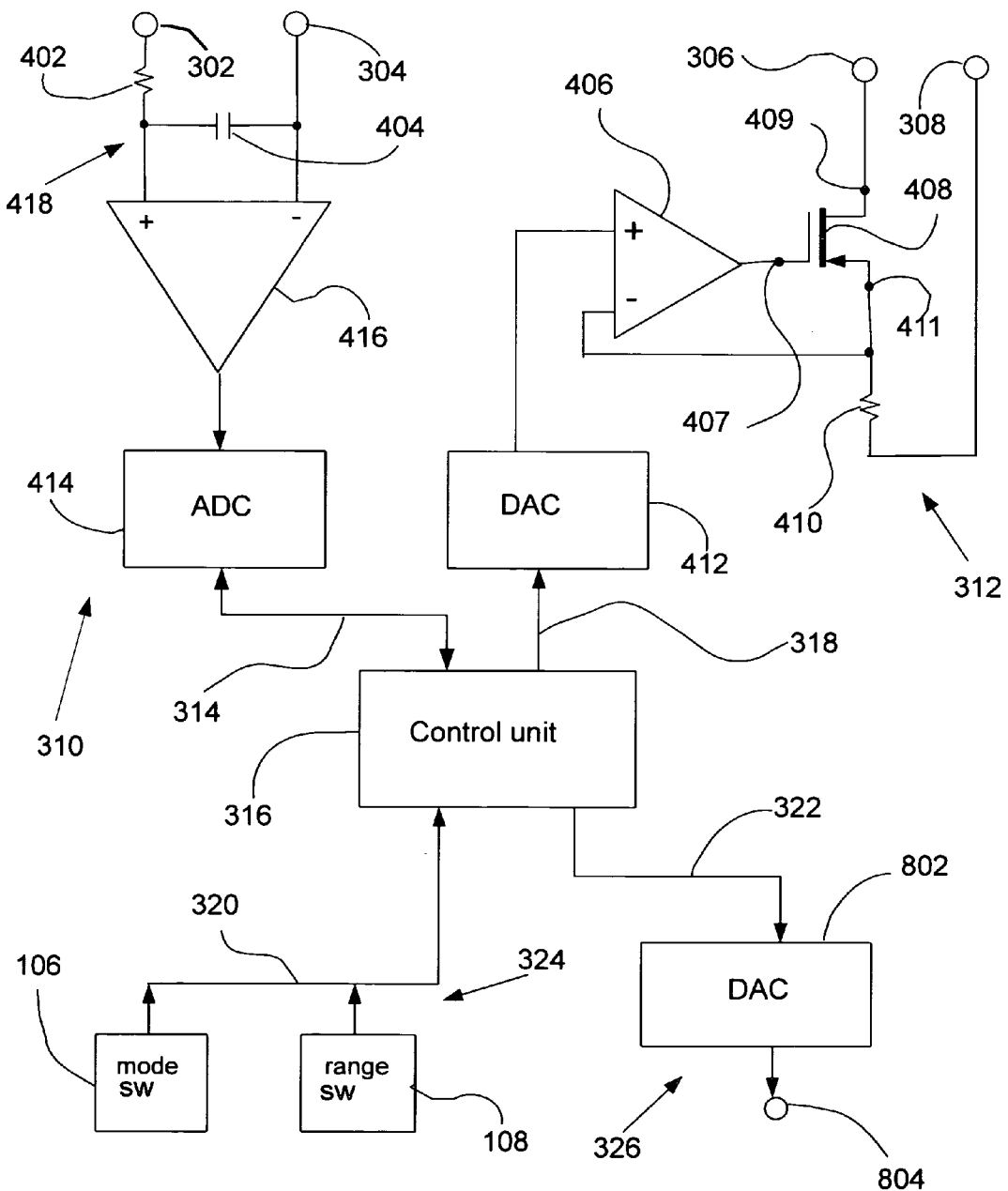

Second Embodiment—FIG. 8

The second embodiment is shown in the block diagram FIG. 8. It differs from FIG. 4 and the first embodiment in that user output unit (326) has been changed to an output DAC (802) and an analog output connector (804) instead of a display device. In this embodiment the display (or other user interface) is external to the device, and link (322) from control unit (316) is now connected to the input of output DAC (802). The output of DAC (802) is connected to output connector (804) which is accessible to the user.

Operation

Second Embodiment—FIG. 8, 9

This embodiment does the same job as the first embodiment, but it is physically smaller, lower in cost, and uses less power. However, it requires the user to provide a voltmeter or other equipment to read the output voltage, since it has no display. Control unit (316) operates the same as in the first embodiment except that when it has calculated the value for the output current, it uses output DAC (802) to scale that value and convert it to an analog voltage so that an external voltmeter (or equivalent) connected to output connector (804), can be read in convenient units. For example, a suitable scaling might be 0.1V=1A; then if an external voltmeter reads 3.28 V, then the output current is known to be 32.8 Amps.

Flow Chart

Figure 9:
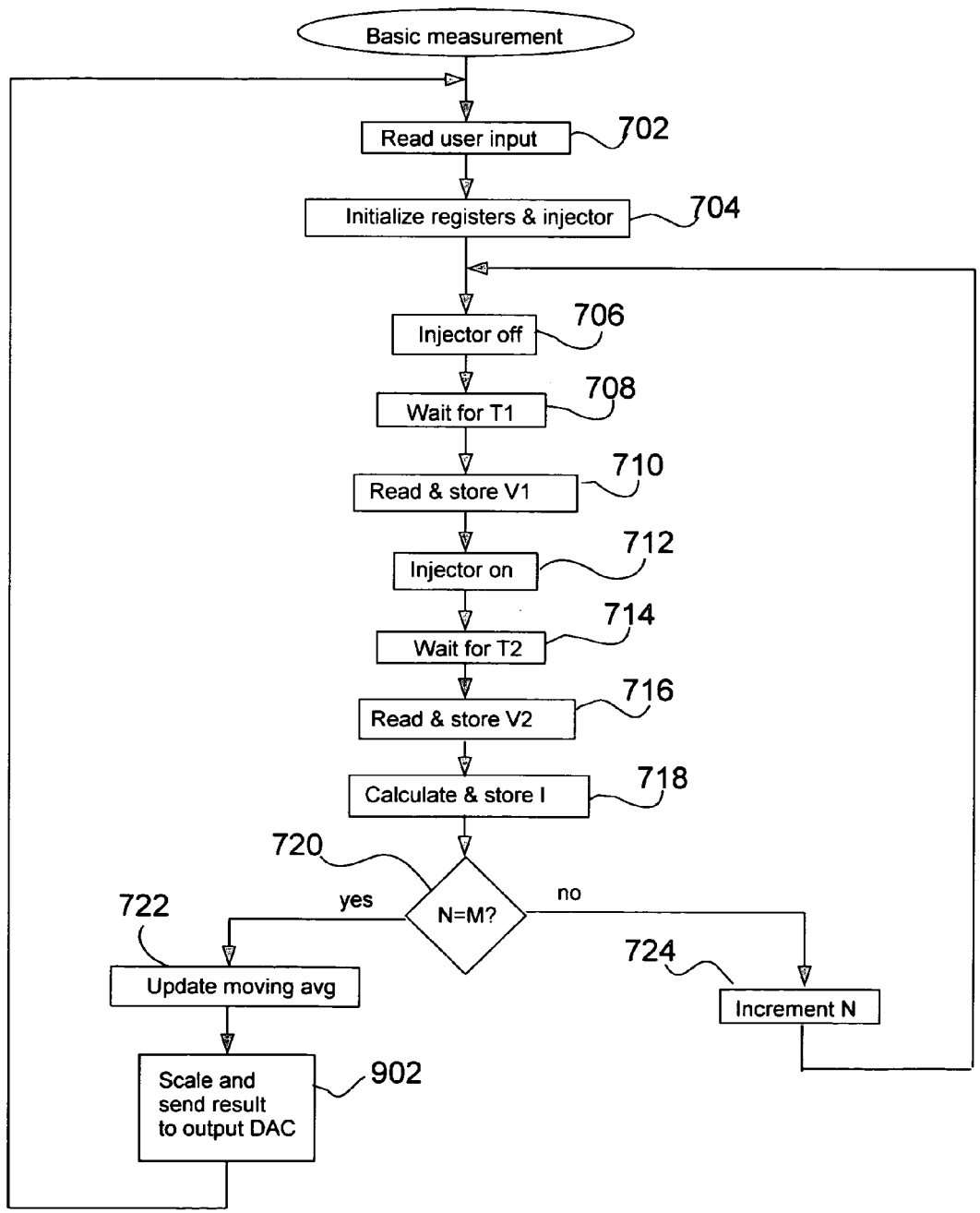

FIG. 9 shows the basic flow chart for control unit (316) in the second embodiment. It is the same as in the first embodiment (FIG. 7) except for item (902) where the output data is sent to DAC (802) instead of a display. At step (902) the result from (718) is scaled so that the output voltage will be conveniently proportional to the average current measured in the unit under test.

Like the first embodiment, this embodiment is also equipped to provide adjustable load transients for testing the stability and speed of response of the power supply under test. This embodiment would make a good accessory to a digital voltmeter product.

Description

Third Embodiment—FIGS. 10, 11, 12, 13, 14

Figure 10:
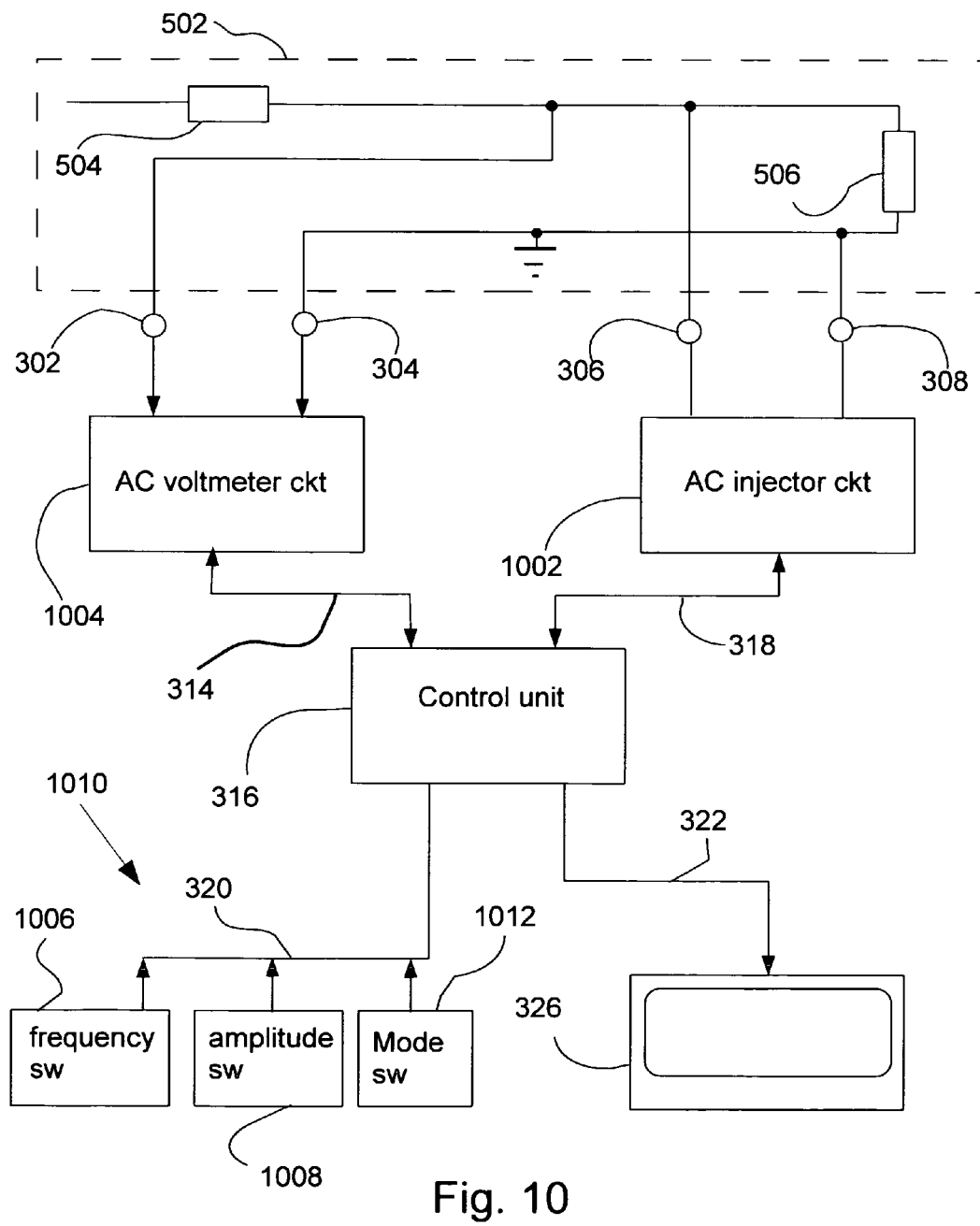

FIG. 10 shows the block diagram of a third embodiment of the non-invasive power supply tester. It is similar to FIG. 5, but AC injector circuit (1002) has replaced the former injector circuit (312), and AC voltmeter circuit (1004) has replaced former voltmeter circuit (310). Within this embodiment, the connections are almost the same as in FIG. 5. However, voltmeter circuit input terminals (302, 304) are connected across load (506) rather than across current sensing element (504). The final change from FIG. 5 is that former user input unit (324) has been replaced by user input unit (1010), comprised of a frequency switch (1006), an amplitude switch (1008), and a mode switch (1012).

Figure 12:
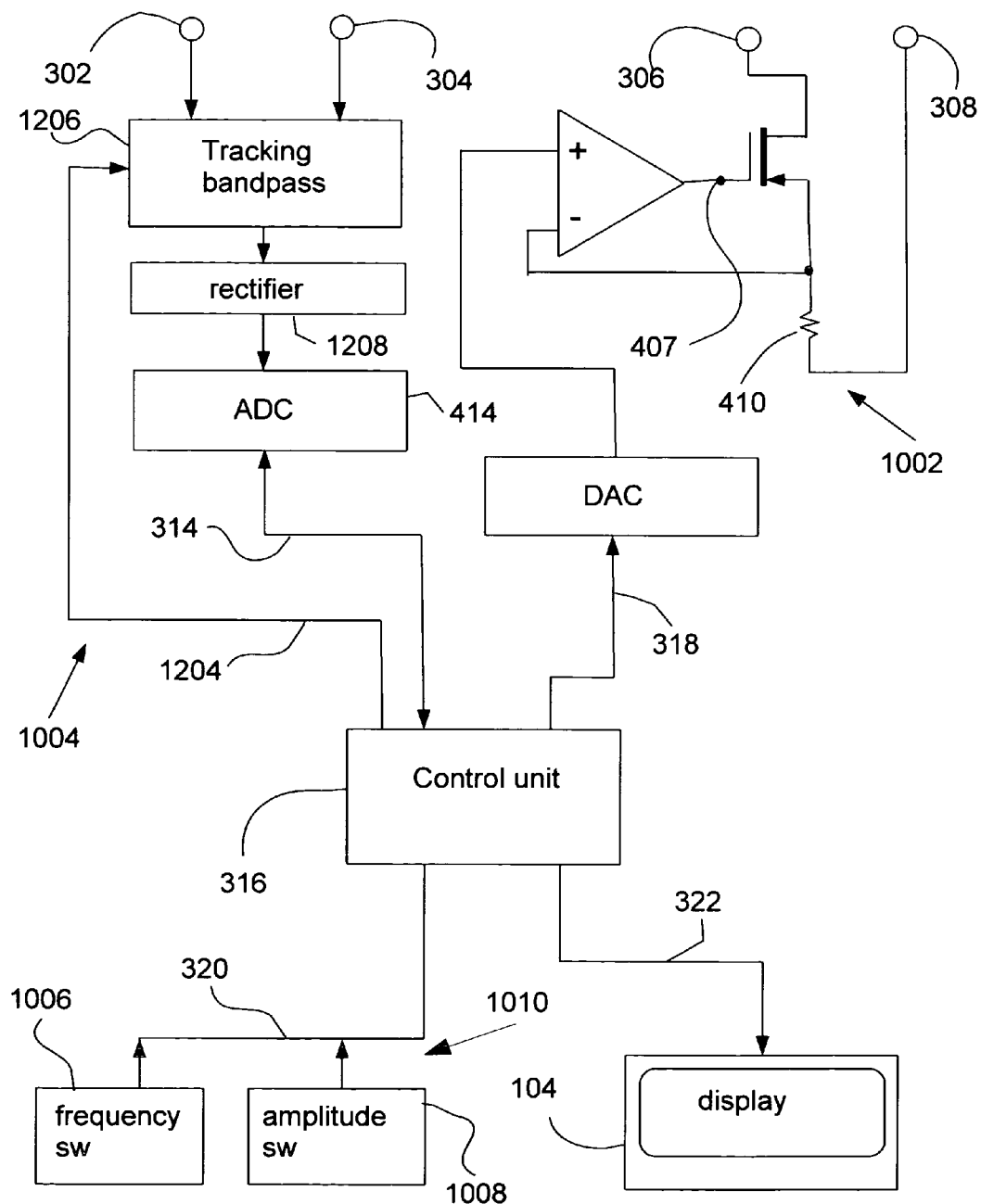

FIG. 12 shows how AC voltmeter (1004) differs from previous embodiments. The input to AC voltmeter (1004) is the input to a tracking bandpass filter (1206) with its output connected to the input of a rectifier (1208). The output put of rectifier (1208) is connected to the input of an ADC (414) (analog-to-digital converter). The output of the ADC is the output of AC voltmeter (1004). Also, there is an added link (1204) from control unit (316) to tracking filter (1206). Rectifier (1208) is a circuit that produces a DC voltage at its output which is predictably related to the amplitude of the output of tracking bandpass filter (1206).

Operation

Third Embodiment—FIGS. 10, 11, 12, 13, 14

In its third embodiment the non-invasive power supply tester has different measurement functions; instead of measuring the output current of the power supply under test, this embodiment is designed to measure the output impedance of the power supply under test at different frequencies. The graph of a regulator's output impedance as a function of frequency is a very good indicator of the regulator's ability to handle fast or repetitive changes in output current, and it is also a good indicator of the stability of the regulator's feedback loop. It dearly indicates the worst case frequency for repetitive load changes.

Figure 14:
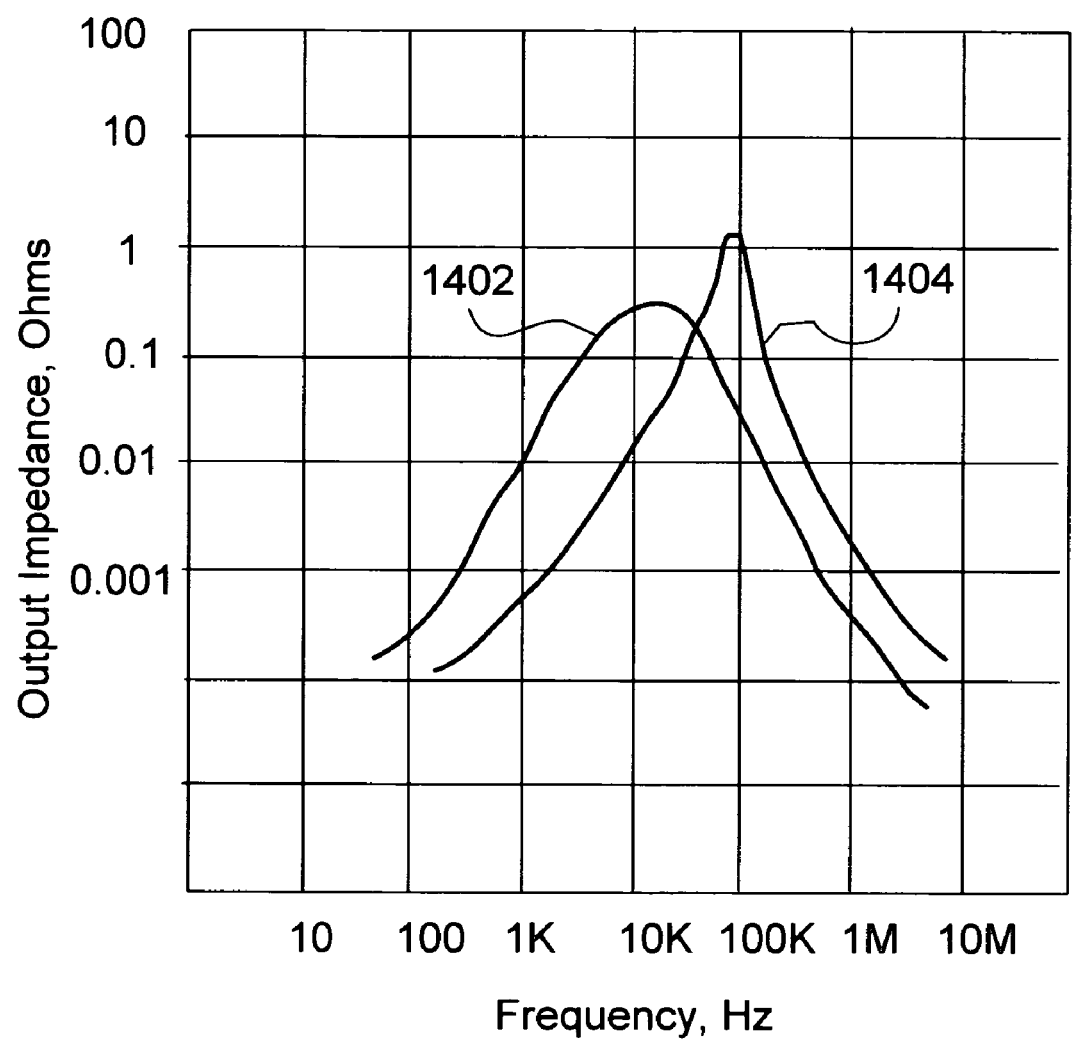

FIG. 14 shows an example of impedance plots for two regulators. The regulator with curve (1402) has a maximum impedance of 0.3 Ohm at a frequency of about 15 KHz, and a relatively stable feedback loop (the peak is not narrow). The regulator with curve (1404) has a maximum impedance of 1.3 Ohms at 90 KHz, and the more narrow peak can be an indication of marginal stability.

AC Injector

The function of AC injector (1002) is to act like an AC current source (very high output impedance) and to inject a controlled amount of sinusoidal AC current into the output of the power supply under test. The injected current must be of precisely known amplitude and frequency content. In this embodiment the injected waveform consists of a DC component plus a single frequency AC component, or in other words, a sine wave with a DC offset. The purpose of the DC offset is to enable the use of a single-ended drive circuit, which is simpler than the alternative bi-polar drive.

Figure 11:
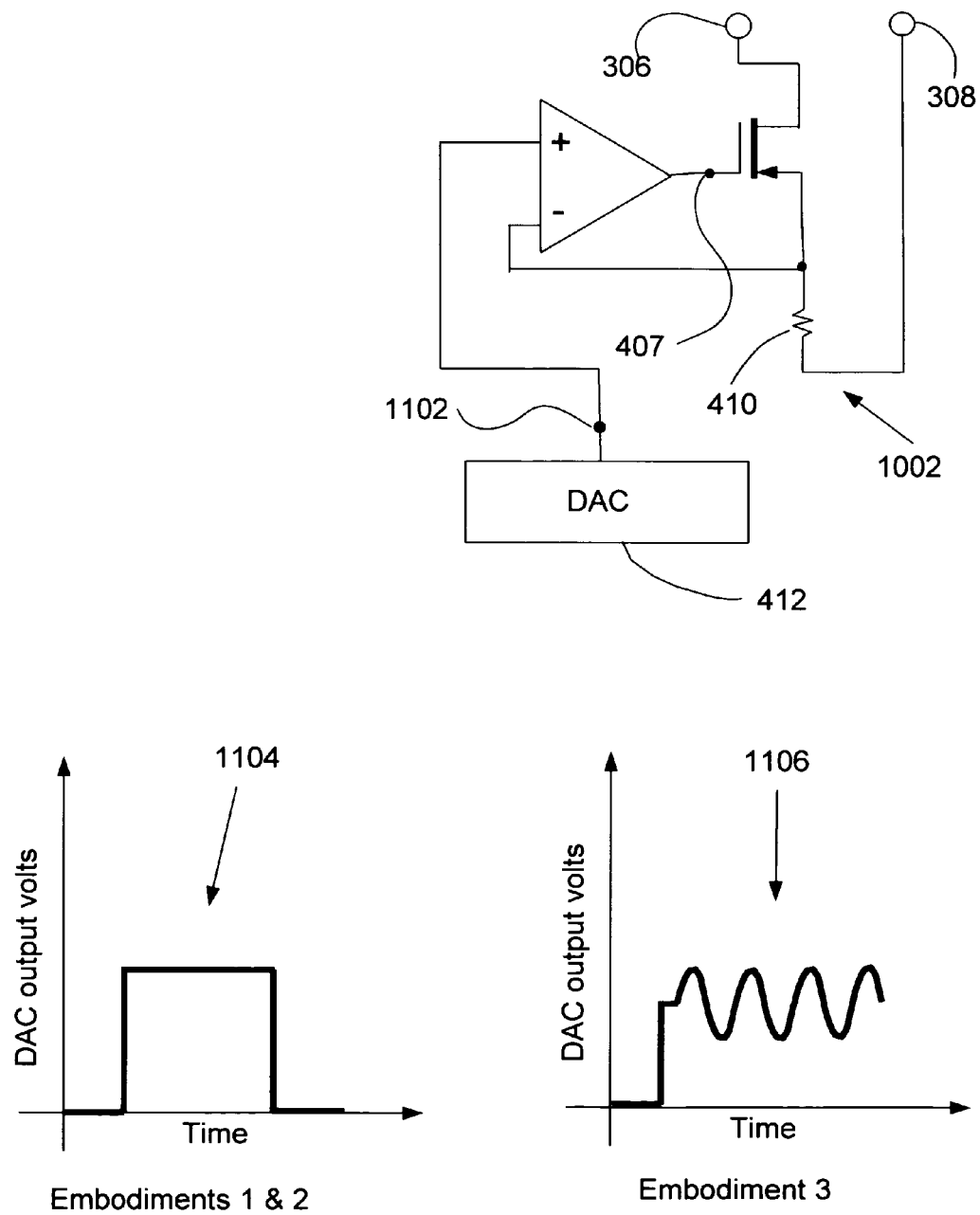

FIG. 11 shows the same injector circuit (312) as in embodiments 1 and 2, and shows that in embodiment 3, DAC (412) behaves differently. Instead of switching between zero and some constant value, as in graph (1104), in embodiment 3 control unit (316) is programmed differently so that link (318) presents a continually changing digital signal to the input of DAC (412), such that its output (1102) is a close approximation to a sine wave with the desired amplitude and frequency, and with at least enough DC offset to keep the sine wave from going below zero. There could also be other hardware configurations to generate sine waves with controlled frequency and amplitude, such as an oscillator with controllable frequency and an amplifier (or attenuator) with controllable gain (or attenuation).

AC Voltmeter (1004)

FIG. 12 shows how voltmeter (310) of the first and second embodiments are replaced by AC Voltmeter (1004) in this embodiment. AC voltmeter (1004) comprises a tracking bandpass filter (1206), a rectifier (1208), and analog-to-digital converter (ADC) (414). Communication link (1204) allows control unit (316) to control, or tune, the center frequency of bandpass filter (1206). Thus when AC injector (1002) is varying the load at a frequency that we may call "F1", AC voltmeter (1004) is tuned to F1 and is measuring the amplitude of variation of load voltage at this particular frequency.

The AC output voltage from tracking bandpass filter (1206) is connected to rectifier (1208) that converts the AC voltage to a predictably related DC voltage. The DC voltage from rectifier (1208) is connected to ADC (414) where it is digitized, and passed to control unit (316) by communication link (314).

Control Unit (316)

In this embodiment control unit (316) does not necessarily differ from those of the previously described embodiments, but differs in how it is programmed.

Flow Chart

Figure 13:
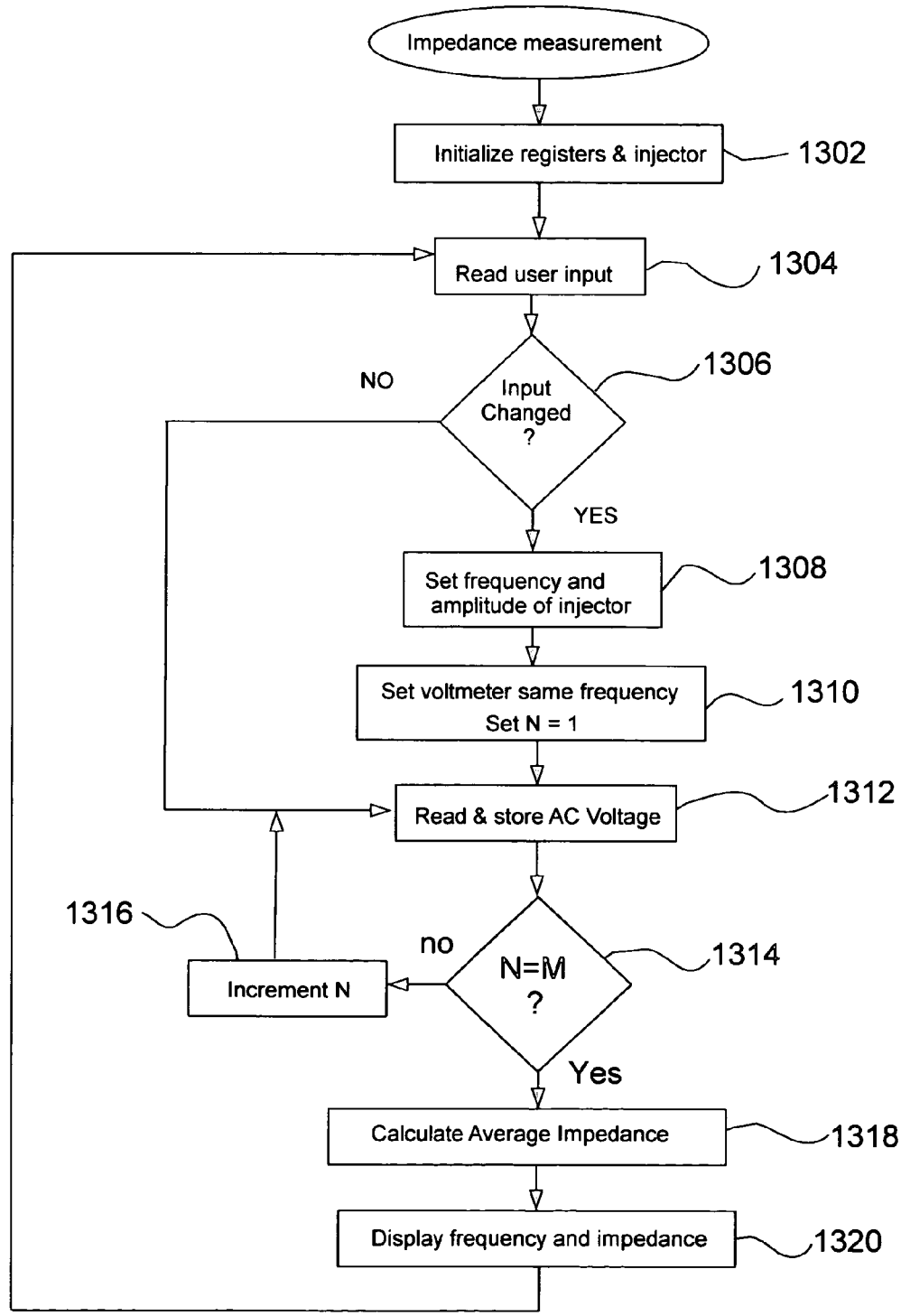

FIG. 13 shows a flow chart that could be used in this embodiment where the user output is a simple digital display of the impedance at one frequency at a time. At the beginning (1302) appropriate registers and flags are initialized, and the AC injector current is set to zero. Then (1304) the state of user input switches (1006, 1008, 1012) are read and stored in memory, identifying the frequency that is to be used by both AC injector (1002) and AC voltmeter (1004), the desired amplitude for AC injector (1002), and the number of samples M for averaging the readings from mode switch (1012). Next (1306) it is determined whether these settings have changed. If there has been a change (1308) the appropriate new parameters are communicated to AC injector (1002), then (1310) to AC voltmeter (1004), and the sample counter variable N is set to 1. Next (1312) AC voltmeter (1004) output is read and stored. Then (1314) there is a branch depending on the value of N. If N=M the required number of samples are available, and the moving average impedance is calculated (1318) and displayed (1320) and we go back to red user input again (1304). If N<M we do not have enough samples for the average, so we increment N (1316) and go back to take another sample (1312). In this simple embodiment the user must manually log each pair of data points from the display and if desired, plot them on paper.

FIG. 14 shows an example of plots (1402, 1404) of output impedance versus frequency for two different power supplies. These curves are provide the following useful information:

1. Each power supply has a worst case frequency where the output impedance is the highest. If the load is capable of varying the output current at this frequency, that will be the worst case for AC load regulation.
2. The narrowness of the peak is an indicator of the stability of the power supply's feedback loop. When the stability starts to get marginal, the peak will be very narrow and sharp at the top.
3. At any frequency covered by the plot the amount of ripple voltage caused by output current variation at that frequency may be calculated.

Clearly by making control unit (316) and user output unit (326) more complex one could display a graph of impedance versus frequency after storing data from a sweep of frequencies, similar to a network analyzer. The general function of control unit (316) in this embodiment is to collect data points of output impedance versus frequency and make them available to the user either by direct display, or by communication with other equipment.

CONCLUSION, RAMIFICATIONS, AND SCOPE

According to the first and second embodiments, a tester has been described for accurately measuring the output current of a power supply without requiring any physical modification to the circuit. In the third embodiment, a similar tester has been described for measuring the output impedance of a power supply at one or more frequencies, thus characterizing the ability of the power supply to maintain constant voltage in the presence of AC variations in output current, again without requiring any physical modification to the circuit.

While the above description contains many specificities, these should not be construed as limitations on the scope of any embodiment, but as exemplifications of the presently preferred embodiments thereof. Many other ramifications and variations are possible within the teachings of the various embodiments. For example, the features of all three embodiments could be combined in one test instrument, and many different methods of communicating with external equipment could be incorporated.

Control unit (316) can range in implementation from manual controls, to a microcontroller, to an embedded processor with an operating system, to an external computer, connected by a communications link, and running custom software.

User input unit (324, 1010) also can range in implementation from local manual controls, to external computer control.

Voltmeter circuits (310, 1004) could be an external digital voltmeter, or any number of voltmeter circuits—anything that suitably measures the voltage needed from the unit under test and makes it available to the non-invasive power supply tester.

Injectors (312, 1002) can be any circuit that acts as a current source and suitably varies the output current of the power supply under test in a precisely known way without driving the power supply under test out of its rated current range.

User output (326) can be any arrangement of parts or equipment that provides the user with either the computed measurement result, or the data necessary for the user to do the computation externally.

Thus the scope of the invention should be determined by the appended claims and their legal equivalents, and not be the examples given.

The invention claimed is:

1. A power supply tester wherein the improvement comprises:
   a voltmeter circuit that can sense the voltage across a pre-existing conducting element of a power supply under test, said voltage being proportional to the output current of said power supply under test by an operational resistance of unknown value, and generate electrical signals quantifying said voltage,
   a current injector circuit that can force quantified fluctuations in said output current of said power supply under test,
   a first means for user input that allows the user of said power supply tester to control the amplitude and waveform of said output current fluctuations, and to define the test to be performed, a second means for user output that makes measurement results available to the user of said power supply tester, and a third means for control that provides memory, computational, and control functions according to a predetermined algorithm that includes collecting data and calculation of output current, said third means being electrically interfaced to said voltmeter circuit, said current injector circuit, said first means, and said second means, whereby said output current of said power supply under test is measured without any prerequisite design constraint on, or alteration of said power supply under test.

2. The power supply tester of claim 1 wherein:
said power supply tester is housed in a protective enclosure, of less than 10,000 cubic centimeter volume, powered by a source selected from the group consisting of
  (a) alternating current power
  (b) dry cell batteries
  (c) rechargeable batteries with external alternating current charger
  (d) alternating current power with dry cell batteries as backup
  (e) alternating current power with rechargeable batteries as backup and a charging circuit that charges said batteries when alternating current is present,
said protective enclosure is equipped with connectors for test probes to provide connections to said voltmeter and for said current injector circuit,
said first means for user input comprises a device selected from the group consisting of:
  (a) a group of electro-mechanical switches,
  (b) a single electro-mechanical switch, and
  (c) a keypad, and
said second means for user output comprises a visible display device selected from the group consisting of:
  (a) a liquid crystal display,
  (b) an electroluminescent display,
  (c) a plurality of light-emitting diodes (LEDs),
  (d) an LED display, and
  (e) a vacuum fluorescent display,
whereby said power supply tester constitutes a portable test instrument that can measure said output current of a power supply under test without requiring any prerequisite design constraint on, or temporary alteration to said power supply under test.

3. The power supply tester of claim 1 wherein
said second means for user output comprises a digital-to-analog converter that generates an output voltage proportional to said output current of said power supply under test and makes this voltage accessible to the user, and
said second means provides scaling such that said output voltage is linearly proportional to said output current of said power supply under test by an integer power of ten,
whereby connecting an external voltmeter to the output of said power supply tester provides convenient readout of said output current of said power supply under test, without requiring any prerequisite design constraint on, or temporary alteration to said power supply under test.

4. The power supply tester of claim 1 further including:
an alternating current voltmeter circuit that can measure the frequency-selective alternating current fluctuations of the output voltage of said power supply under test,
an alternating current injector circuit can generate alternating current fluctuations in said output current of said power supply under test, said alternating current fluctuations being of known amplitude and frequency content, and a fourth means for control that provides memory, computational, and control functions according to a predetermined algorithm for collecting data, calculating output impedance, storing frequency and alternating current voltage data, and making said data available to the user, whereby both the DC output current of said power supply under test, and the output impedance of said power supply under test at a plurality of frequencies, can be measured without requiring any prerequisite design constraint on, or alteration of said power supply under test.

5. The power supply tester of claim 1 further including:
a fifth means for combining the functions of said first means for user input and second means for user output, along with their communication links to said third means for control, into a single unit comprising a touchscreen,
whereby an instrument with a touchscreen for user interface can measure said output current of said power supply under test without any prerequisite design constraint on, or alteration of said power supply under test.

6. A power supply test method comprising:
measuring the voltage drop across a component of a power supply under test, said component being one that is conducting the output current of said power supply under test, and said component being one that is preexisting in said power supply under test, and the resistance of said component being unknown,
forcing a predetermined change in said output current of said power supply under test,
calculating the value of said output current of said power supply under test by solving a set of linear equations involving multiple measurements of said DC voltage drop, and measurement requirements information obtained through a first means for user input, and
making said value of output current available to the user through a second means for user output,
whereby said output current is measured without requiring any prerequisite design constraint on, or temporary alteration of said power supply under test.

7. The power supply testing method of claim 6 further including:
forcing a predetermined and continuous waveform of fluctuations in the output current of said power supply under test, at a predetermined frequency,
measuring the amplitude of fluctuations of the output voltage of said power supply under test at said predetermined frequency,
calculating the output impedance of said power supply under test at said predetermined frequency,
synchronously varying the frequencies of said fluctuations in output current and said fluctuations in output voltage, and
making impedance versus frequency data available to the user
whereby said power supply test method provides measurements of both output current and output impedance without requiring any prerequisite design constraint on, or temporary alteration of said power supply under test.

8. A power supply tester wherein the improvement comprises:
an alternating current voltmeter circuit that can measure the frequency-selective alternating current fluctuations of the output voltage of the power supply under test, an alternating current injector circuit can generate alternating current fluctuations in the output current of the power supply under test, said alternating current fluctuations being of known amplitude and frequency content, and without requiring alteration of said power supply under test, a first means for user input that allows the user of said power supply tester to control the amplitude and waveform of said output current fluctuations, and to define the test to be performed, a second means for user output that makes measurement results available to the user of said power supply tester, and a third means for control that provides memory, computational, and control functions according to a predetermined algorithm that includes collecting data and calculation of output impedance, said third means being electrically interconnected to said voltmeter circuit, said current injector circuit, said first means, and said second means, whereby said output impedance of said power supply under test is measured at a plurality of frequencies, without requiring any prerequisite design constraint on, or alteration of said power supply under test.

9. The power supply tester of claim 8 wherein:

said power supply tester is housed in a protective enclosure, of less than 10,000 cubic centimeter volume, powered by a source selected from the group consisting of
(a) alternating current power
(b) dry cell batteries
(c) rechargeable batteries with external alternating current charger
(d) alternating current power with dry cell batteries as backup
(e) alternating current power with rechargeable batteries as backup and a charging circuit that charges said batteries when alternating current is present, said protective enclosure is equipped with connectors for test probes to provide connections to said voltmeter and for said current injector circuit, and said first means for user interface comprises a touchscreen, whereby said power supply tester constitutes a portable test instrument that can measure said output current of a power supply under test without requiring any prerequisite design constraint on, or temporary alteration to said power supply under test.

\* \* \* \* \*